(12) United States Patent
Morikazu et al.

(10) Patent No.: US 10,886,159 B2
(45) Date of Patent: Jan. 5, 2021

(54) METHOD OF PROCESSING WAFER

(71) Applicant: DISCO CORPORATION, Tokyo (JP)

(72) Inventors: Hiroshi Morikazu, Tokyo (JP); Tasuku Koyanagi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 7 days.

(21) Appl. No.: 16/008,335

(22) Filed: Jun. 14, 2018

(65) Prior Publication Data

US 2018/0366362 A1 Dec. 20, 2018

(30) Foreign Application Priority Data

Jun. 16, 2017 (JP) ................................. 2017-118338

(51) Int. Cl.
*H01L 21/683* (2006.01)
*H01L 21/67* (2006.01)
*H01L 21/304* (2006.01)

(52) U.S. Cl.
CPC ........ *H01L 21/6836* (2013.01); *H01L 21/304* (2013.01); *H01L 21/6715* (2013.01); *H01L 21/67115* (2013.01); *H01L 21/67132* (2013.01); *H01L 2221/68381* (2013.01)

(58) Field of Classification Search
CPC ........... H01L 21/6836; H01L 21/67132; H01L 21/6715; H01L 21/304; H01L 21/67115; H01L 2221/68381; H01L 2221/68386
USPC .................. 156/247; 438/113, 458
See application file for complete search history.

(56) References Cited

U.S. PATENT DOCUMENTS

| 7,534,498 | B2 * | 5/2009 | Noda ..................... B32B 43/006 428/446 |
| 7,892,949 | B2 * | 2/2011 | Abe ................... H01L 21/67092 438/462 |
| 8,058,103 | B2 * | 11/2011 | Fukumitsu ......... B23K 26/0884 438/110 |
| 8,181,688 | B2 * | 5/2012 | Johnson ............ H01L 21/67092 156/711 |
| 9,484,227 | B1 * | 11/2016 | Cheng ................... H01L 21/486 |

(Continued)

FOREIGN PATENT DOCUMENTS

WO WO03049164 A1 6/2003

OTHER PUBLICATIONS

Anysilicon—Semiconductor Wafer Overview and Facts, 2015 (Year: 2015).*

*Primary Examiner* — Michael N Orlando
*Assistant Examiner* — Abhishek A Patwardhan
(74) *Attorney, Agent, or Firm* — Greer Burns & Crain Ltd.

(57) ABSTRACT

A method of processing a wafer includes: preparing a support substrate that can transmit ultraviolet rays having a wavelength of 300 nm or shorter and can support the wafer thereon; integrating a face side of the wafer and the support substrate by sticking the face side of the wafer and the support substrate to each other with an UV-curable resin whose adhesive power can be lowered by ultraviolet rays applied thereto interposed therebetween, thereby integrally combining the wafer and the support substrate with each other; processing a reverse side of the wafer; destroying the UV-curable resin by applying a focused laser beam in an ultraviolet range having a wavelength of 300 nm or shorter from a support substrate side; and peeling off the support substrate from the face side of the wafer.

8 Claims, 5 Drawing Sheets

(56) References Cited

U.S. PATENT DOCUMENTS

| | | | |
|---|---|---|---|
| 2004/0048419 A1* | 3/2004 | Kitamura | H01L 21/3043 438/113 |
| 2007/0215581 A1* | 9/2007 | Kato | B28D 1/221 219/121.69 |
| 2007/0298587 A1* | 12/2007 | Park | B23K 26/0732 438/458 |
| 2014/0038392 A1* | 2/2014 | Yonehara | H01L 21/304 438/463 |
| 2017/0084543 A1* | 3/2017 | Lin | H01L 24/19 |
| 2017/0125268 A1* | 5/2017 | Dang | H01L 21/6835 |
| 2018/0061638 A1* | 3/2018 | Yamazaki | H01L 31/1896 |

* cited by examiner

METHOD OF PROCESSING WAFER

BACKGROUND OF THE INVENTION

Field of the Invention

The present invention relates to a method of processing a wafer that has a face side demarcated by a plurality of intersecting projected dicing lines into a plurality of areas with respective devices formed therein.

Description of the Related Art

Wafers that have a plurality of devices such as integrated circuits (ICs), large scale integration (LSI) circuits, power devices, light emitting diodes (LEDs), or the like formed in respective areas on a face side thereof demarcated by a plurality of intersecting projected dicing lines are divided into individual device chips by a dicing apparatus, a laser processing apparatus, or the like. The individual device chips thus fabricated are used in electric appliances such as mobile phones, personal computers, communication equipment, and so on.

The reverse side of such a wafer is ground to reduce the wafer to a desired thickness in order to make the devices capable of better heat dissipation, lighter in weight, and smaller in size. If the thickness of a wafer is reduced to 50 or 30 μm, for example, then the wafer is liable to bend like a sheet of paper and becomes difficult to deliver to a next processing step. In view of this difficulty, the inventors of the present invention have proposed a technology in which the face side of a wafer is stuck to a support substrate of glass with an ultraviolet (UV)-curable resin interposed therebetween, so that even if the wafer is processed to a thin shape, it can be delivered to a next processing step such as a plasma etching step, a sputtering step, or the like (see, for example, PCT Patent Publication No. WO03/049164).

SUMMARY OF THE INVENTION

According to the technology disclosed in PCT Patent Publication No. WO03/049164, however, the support substrate may sometimes fail to be peeled off from the face side of the wafer because the adhesive power of the UV-curable resin may not be lowered sufficiently by applying ultraviolet rays from the support substrate side to the UV-curable resin to cure the latter.

It is therefore an object of the present invention to provide a method of processing a wafer to allow a support substrate to be peeled off reliably from the face side of the wafer.

In accordance with an aspect of the present invention, there is provided a method of processing a wafer that has a face side demarcated by a plurality of intersecting projected dicing lines into a plurality of areas with respective devices formed therein, including: a support substrate preparing step of preparing a support substrate that can transmit ultraviolet rays having a wavelength of 300 nm or shorter and can support the wafer thereon; an integrating step of integrating a face side of the wafer and the support substrate by sticking the face side of the wafer and the support substrate to each other with an UV-curable resin whose adhesive power can be lowered by ultraviolet rays applied thereto interposed therebetween, thereby integrally combining the wafer and the support substrate with each other; after the integrating step, a processing step of processing a reverse side of the wafer; after the processing step, a UV-curable resin destroying step of destroying the UV-curable resin by applying a focused laser beam in an ultraviolet range having a wavelength of 300 nm or shorter from a support substrate side; and after the UV-curable resin destroying step, a peeling step of peeling off the support substrate from the face side of the wafer.

Preferably, the method should further include, after the processing step and before the UV-curable resin destroying step, a frame supporting step of supporting on an annular frame the wafer integrally combined with the support substrate by sticking the reverse side of the wafer to a dicing tape and sticking an outer peripheral portion of the dicing tape to the annular frame having an opening defined therein that is large enough to accommodate the wafer therein. At the UV-curable resin destroying step, the laser beam applied to destroy the UV-curable resin should preferably have a peak power density ranging from 5 to 50 GW/cm$^2$. The support substrate should preferably include a glass substrate, and the wafer should preferably include on the face side thereof power devices or thin film devices including thin film transistors (TFTs) or thin film inductors, and is selected from a group consisting of an Si wafer, an SiC wafer, and a GaN wafer.

Since the method of processing a wafer according to the present invention includes the UV-curable resin destroying step in which a focused laser beam in an ultraviolet range having a wavelength of 300 nm or shorter is applied from the support substrate side, thereby destroying the UV-curable resin, the UV-curable resin is destroyed and the support substrate can reliably be peeled off from the face side of the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
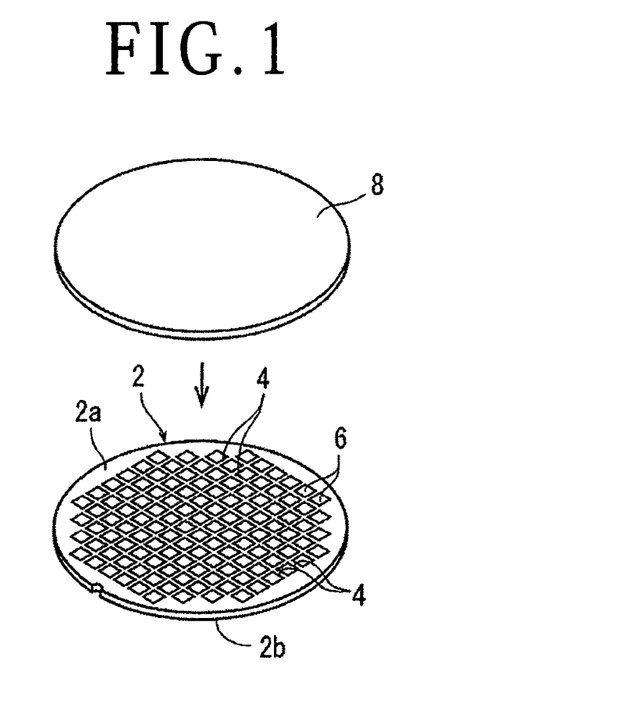
FIG. 1 is a perspective view of a wafer and a support substrate.

A method of processing a wafer according to an embodiment of the present invention will hereinafter be described below with reference to the drawings. FIG. 1 depicts in perspective a wafer 2 to be processed by the processing method according to the present embodiment. The wafer 2, which is of a disk shape having a thickness of approximately 700 μm, has a face side 2a demarcated by a grid of projected dicing lines 4 into a plurality of areas with respective devices 6 formed therein. The wafer 2 may be an Si wafer made of silicon (Si), an SiC wafer made of silicon carbide (SiC), or a GaN wafer made of gallium nitride (GaN). The devices 6 may be power devices or thin film devices including thin film transistors (TFTs) or thin film inductors.

According to the present embodiment, a support substrate preparing step is initially carried out to prepare a support substrate that can transmit ultraviolet rays having a wavelength of 300 nm or shorter and can support the wafer 2 thereon. According to the present embodiment, as depicted in FIG. 1, a support substrate 8 that is prepared in the support substrate preparing step is a disk-shaped transparent glass substrate that can transmit ultraviolet rays having a wavelength of 300 nm or shorter. The support substrate 8 has a diameter that is essentially the same as the diameter of the wafer 2 and also has a thickness of approximately 1000 μm. Therefore, the support substrate 8 is rigid enough to support the wafer 2 stably thereon even if a grinding step is carried out to reduce the thickness of the wafer 2 to approximately several tens μm. The support substrate may not be a glass substrate as long as it can transmit ultraviolet rays having a wavelength of 300 nm or shorter and can support the wafer 2 thereon. For example, the support substrate may be made of a resin material such as polyethylene terephthalate (PET).

Figures 2A, 2B:
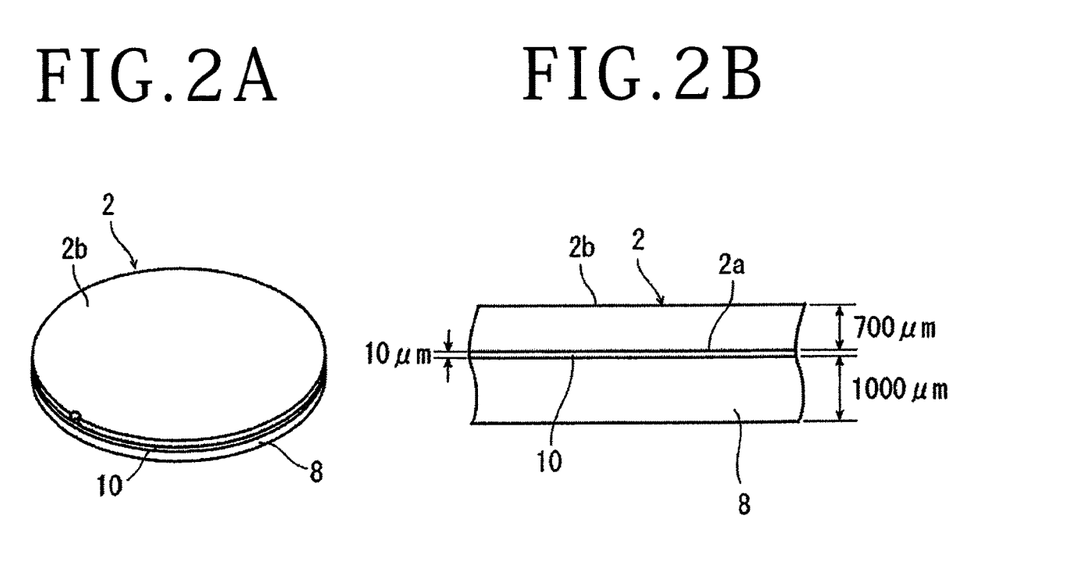
FIG. 2A is a perspective view of the wafer and the support substrate that have been integrated in an integrating step.
FIG. 2B is an enlarged fragmentary cross-sectional view of the wafer and the support substrate that have been integrated in the integrating step.

After the support substrate preparing step is carried out, as depicted in FIGS. 2A and 2B, an integrating step is carried out to stick the face side 2a of the wafer 2 and one surface of the support substrate 8 to each other through a UV-curable resin 10 whose adhesive power can be lowered by ultraviolet (UV) rays applied thereto, so that the wafer 2 and the support substrate 8 are integrally combined with each other with the UV-curable resin 10 interposed therebetween. FIG. 2A depicts in perspective the wafer 2 and the support substrate 8 that are integrally combined with each other with the UV-curable resin 10 interposed therebetween, as viewed from a reverse side 2b of the wafer 2. According to the present embodiment, as depicted in FIG. 2A, the wafer 2 and the support substrate 8 are integrally combined with each other such that the diametrical center of the wafer 2 and the diametrical center of the support substrate 8 are aligned with each other. The UV-curable resin 10 that is used in the integrating step may be NW-126-75S manufactured by Denka Co., Ltd., SU-8 manufactured by Nippon Kayaku Co., Ltd., or Hitaloid 7903 manufactured by Hitachi Chemical Co., Ltd., for example. As depicted in FIG. 2B, the UV-curable resin 10 interposed between the wafer 2 and the support substrate 8 that are integrally combined with each other may have a thickness of approximately 10 μm.

Figure 3:
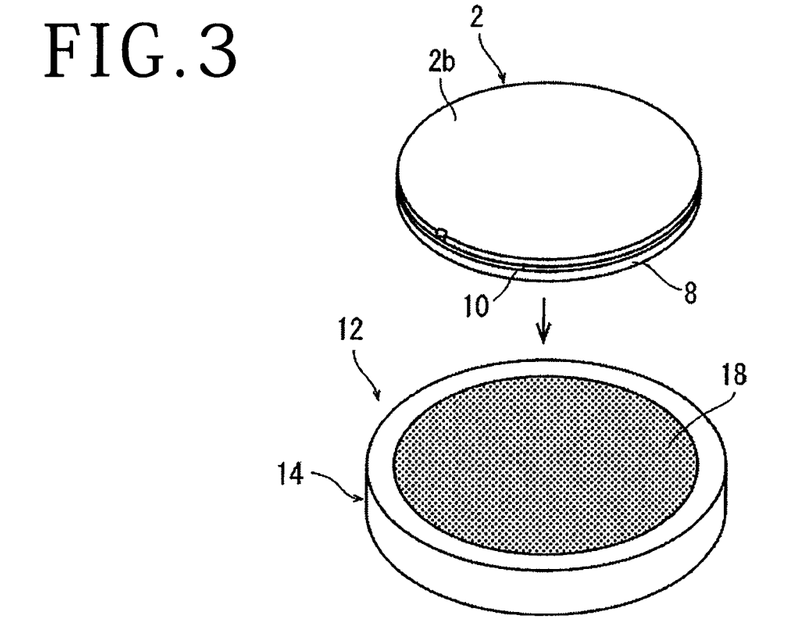
FIG. 3 is a perspective view depicting the manner in which the wafer and the support substrate that have been integrated are placed onto a chuck table of a grinding apparatus.
Figure 4:
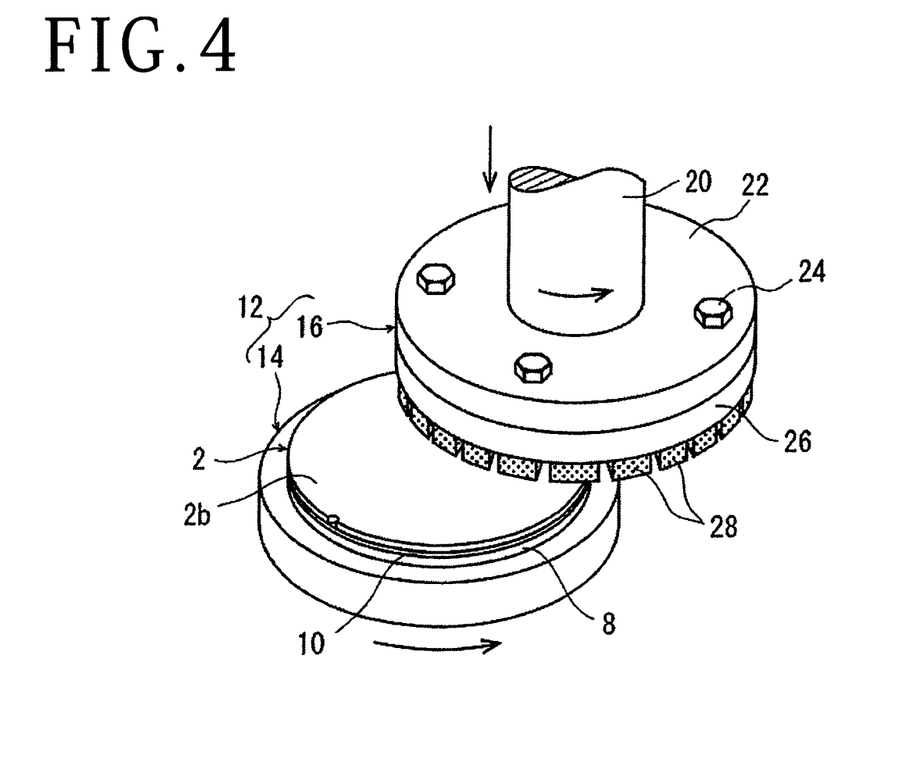
FIG. 4 is a perspective view depicting the manner in which a processing step is carried out.

After the integrating step is carried out, a processing step is carried out to process the reverse side 2b of the wafer 2. The processing step may include a grinding step of grinding the reverse side 2b of the wafer 2 to thin the wafer 2. According to the present embodiment, the grinding step will be described below as an example of the processing step. The grinding step can be performed using a grinding apparatus 12 partly depicted in FIGS. 3 and 4. As depicted in FIG. 4, the grinding apparatus 12 includes a circular chuck table 14 for holding a workpiece thereon and a grinding unit 16 for grinding the workpiece held on the chuck table 14. As depicted in FIG. 3, a circular suction chuck 18 that is made of a porous material and extends substantially horizontally is disposed on an upper surface of the chuck table 14. The suction chuck 18 is connected to a suction unit, not depicted, through a fluid channel. The chuck table 14 attracts and holds a workpiece placed on an upper surface of the suction chuck 18 under a suction force that is applied to the upper surface of the suction chuck 18 by the suction unit. The chuck table 14 can be rotated about a vertical axis extending through the diametrical center of the chuck table 14 by a rotating unit, not depicted. As depicted in FIG. 4, the grinding unit 16 includes a vertically extending cylindrical spindle 20 having an upper end coupled to an electric motor, not depicted, and a disk-shaped wheel mount 22 fixed to the lower end of the spindle 20. An annular grinding wheel 26 is fastened to the lower surface of the wheel mount 22 by bolts 24, and a plurality of grinding stones 28 arranged in an annular array at circumferentially spaced intervals are fixed to an outer circumferential marginal edge of the lower surface of the grinding wheel 26. The center of rotation of the grinding wheel 26 is displaced off the center of rotation of the chuck table 14 such that the grinding stones 28 follow a path extending through the center of rotation of the chuck table 14. Therefore, when the workpiece held on the suction chuck 18 on the upper surface of the chuck table 14 comes into contact with the grinding stones 28 while the chuck table 14 and the grinding wheel 26 are rotating relatively to each other, the entire upper surface of the workpiece is ground by the grinding stones 28.

In the grinding step, as depicted in FIG. 3, the support substrate 8 that supports the wafer 2 with the reverse side 2b facing upwardly is attracted to and held on the suction chuck 18 on the upper surface of the chuck table 14. At this time, the diametrical center of the wafer 2 and the diametrical center (the center of rotation) of the chuck table 14 are aligned with each other. Then, as depicted in FIG. 4, the chuck table 14 is rotated by the rotating unit at a predetermined speed, e.g., 300 rpm, counterclockwise as viewed from above. The spindle 20 is rotated by the electric motor at a predetermined speed, e.g., 6000 rpm, counterclockwise as viewed from above. Then, the spindle 20 is lowered by a lifting/lowering unit, not depicted, of the grinding apparatus 12 to bring the grinding stones 28 into contact with the reverse side 2b of the wafer 2. Since the diametrical center of the wafer 2 and the diametrical center of the chuck table 14 are aligned with each other, the entire reverse side 2b of the wafer 2 is ground by the grinding stones 28. After the grinding stones 28 have come into contact with the reverse side 2b of the wafer 2, the spindle 20 is continuously lowered at a predetermined grinding rate, e.g., 1.0 μm/s. In this manner, the grinding stones 28 grind the reverse side 2b of the wafer 2 to thin the wafer 2 to a desired thickness, e.g., ranging from approximately 30 to 50 μm.

Figure 5:
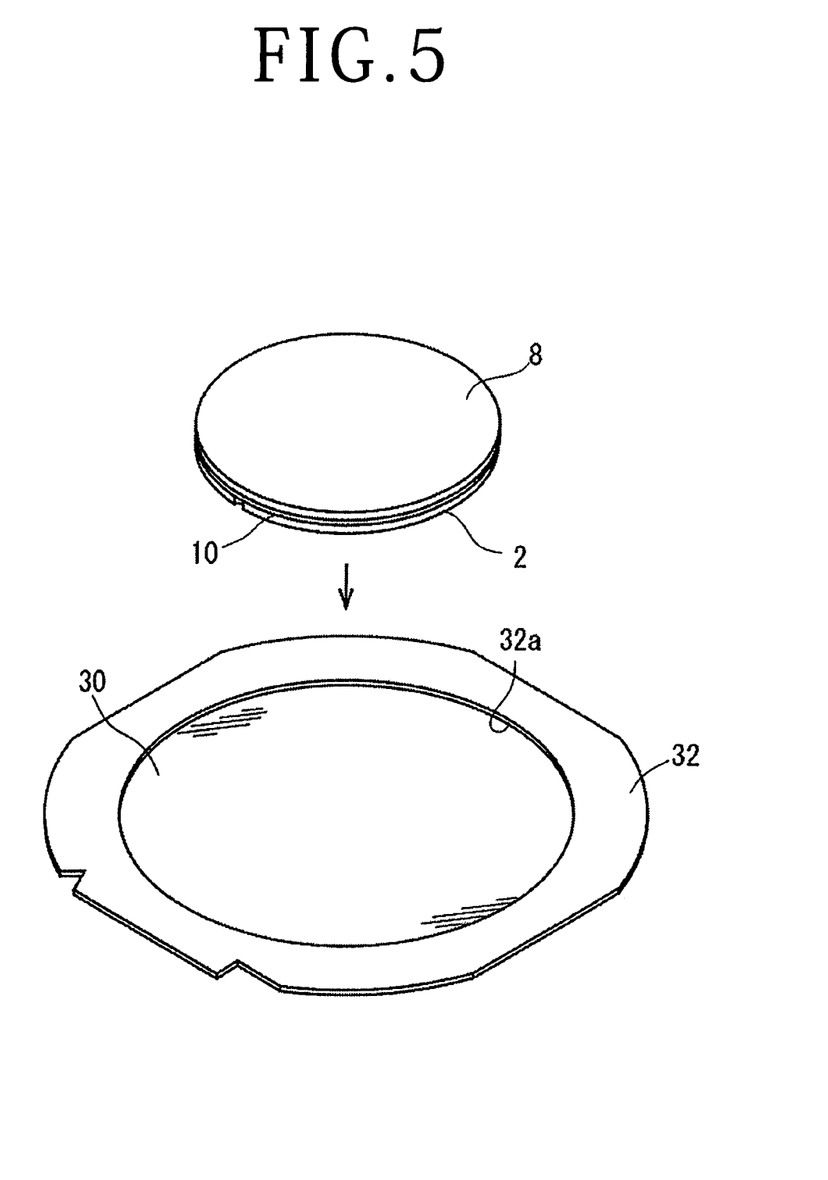
FIG. 5 is a perspective view depicting the manner in which a frame supporting step is carried out.

According to the present embodiment, after the grinding step is carried out, as depicted in FIG. 5, a frame supporting step is performed to stick the reverse side 2b of the wafer 2 to a dicing tape 30 and also stick an outer peripheral portion of the dicing tape 30 to an annular frame 32 having an opening 32a defined therein that is large enough to accommodate the wafer 2 therein, so that the wafer 2 integrally combined with the support substrate 8 is supported on the annular frame 32 by the dicing tape 30.

According to the present embodiment, the frame supporting step is followed by a UV-curable resin destroying step that is carried out to apply a focused laser beam of ultraviolet rays having a wavelength of 300 nm or shorter to the wafer 2 from the support substrate 8 side, thereby destroying the UV-curable resin 10. The UV-curable resin destroying step can be performed using a laser processing apparatus 34 that is partly depicted in FIG. 6A, for example. The laser processing apparatus 34 includes a laser oscillator, not depicted, for oscillating a pulsed laser beam LB of ultraviolet rays having a wavelength of 300 nm or shorter, a chuck table, not depicted, for holding a workpiece thereon, and a condenser 36 for focusing the pulsed laser beam LB emitted from the laser oscillator and applying the focused pulsed laser beam LB to the workpiece held on the chuck table. The chuck table, which is of a circular shape and is arranged to attract the workpiece to its upper surface, can be rotated about a vertical axis extending through the diametrical center of the chuck table 14 by a rotating unit, not depicted. The condenser 36 is movable back and forth in X-axis directions by an X-axis moving unit, not depicted, and is also movable back and forth in Y-axis directions by a Y-axis moving unit, not depicted. The X-axis directions represent directions one of which is indicated by the arrow X, whereas the Y-axis directions represent directions one of which is indicated by the arrow Y. The X-axis directions and the Y-axis directions jointly define a plane that is essentially horizontal.

Figure 6A:
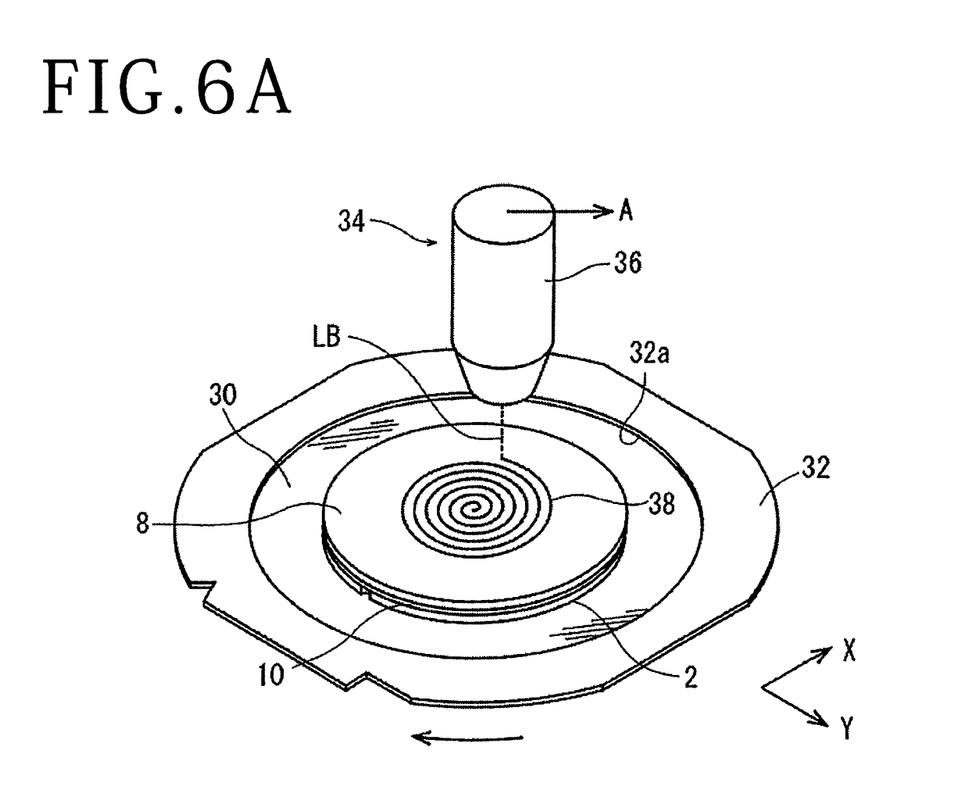
FIG. 6A is a perspective view depicting the manner in which a UV-curable resin destroying step is carried out.
Figure 6B:
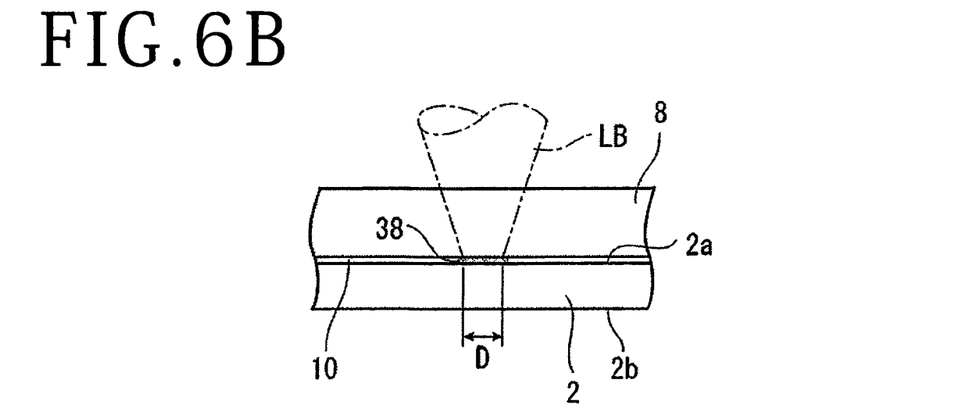
FIG. 6B is an enlarged fragmentary cross-sectional view of the wafer and the support substrate, depicting the manner in which the UV-curable resin destroying step is carried out thereon.

The UV-curable resin destroying step will further be described below with reference to FIGS. 6A and 6B. The wafer 2 supported on the annular frame 32 with the support substrate 8 facing upwardly is attracted to and held by the upper surface of the chuck table of the laser processing apparatus 34. At this time, the diametrical center of the support substrate 8 and the diametrical center of the chuck table are aligned with each other. Then, an image capturing unit, not depicted, of the laser processing apparatus 34 captures an image of the wafer 2 integral with the support substrate 8 from above (from the support substrate 8 side). Based on the image captured by the image capturing unit, the X-axis moving unit and the Y-axis moving unit of the laser processing apparatus 34 move the condenser 36 to position the condenser 36 above the diametrical center of the support substrate 8. Thereafter, a focused spot position adjusting unit, not depicted, of the laser processing apparatus 34 moves the condenser 36 along its optical path, i.e., upwardly or downwardly, to adjust the diameter D of a focused spot of the pulsed laser beam LB on the UV-curable resin 10 such that the peak power density of the pulsed laser beam LB on the UV-curable resin 10 is in the range from 5 to 50 GW/cm².

Then, the rotating unit of the laser processing apparatus 34 rotates the chuck table at a predetermined rotational speed about its own axis clockwise as viewed from above. While the X-axis moving unit or the Y-axis moving unit of the laser processing apparatus 34 is moving the condenser 36 with respect to the chuck table radially outwardly of the chuck table, e.g., in the direction indicated by the arrow A in FIG. 6A, the condenser 36 emits a pulsed laser beam LB of ultraviolet rays having a wavelength of 300 nm or shorter toward the support substrate 8. Specifically, the condenser 36 applies the pulsed laser beam LB in a spiral pattern to the support substrate 8, as depicted in FIG. 6A. Since the support substrate 8 is a glass substrate that can transmit ultraviolet rays having a wavelength of 300 nm or shorter therethrough, the pulsed laser beam LB passes through the support substrate 8 and is absorbed by the UV-curable resin 10. The UV-curable resin 10 is thus destroyed, losing its adhesive power. Losing the adhesive power of the UV-curable resin 10 refers to not only completely losing the adhesive power of the UV-curable resin 10, but also reducing the adhesive power of the UV-curable resin 10 to the extent that the support substrate 8 can be peeled off from the wafer 2.

According to the present embodiment, inasmuch as the peak power density of the pulsed laser beam LB on the UV-curable resin 10 is set to a value in the range from 5 to 50 GW/cm² (5 to 50×10⁹ W/cm²), the pulsed laser beam LB can reliably destroy only the UV-curable resin 10 without causing damage to the support substrate 8 and the wafer 2, i.e., without causing damage to the devices 6 formed on the face side 2a of the wafer 2. In FIG. 6A, marks 38 where the pulsed laser beam LB is applied to the support substrate 8 are depicted as being spaced radially of the support substrate 8 for illustrative purposes. Actually, the pulsed laser beam LB is applied such that radially adjacent ones of the marks 38 overlap each other on the UV-curable resin 10, thereby destroying the UV-curable resin 10 in its entirety. The peak power density $E_p$ (W/cm²) of the pulsed laser beam LB is defined by the average output power P (W) of the pulsed laser beam LB, the repetitive frequency F (Hz) thereof, the pulse duration $\tau$ (s) thereof, and the area $S=\cup D^2/4$ (cm²) of the focused laser beam spot according to the equation $E_p=P/(F\cdot\tau\cdot S)$, where D represents the focused spot of the pulsed laser beam LB on the UV-curable resin 10, as described above.

Figure 7:
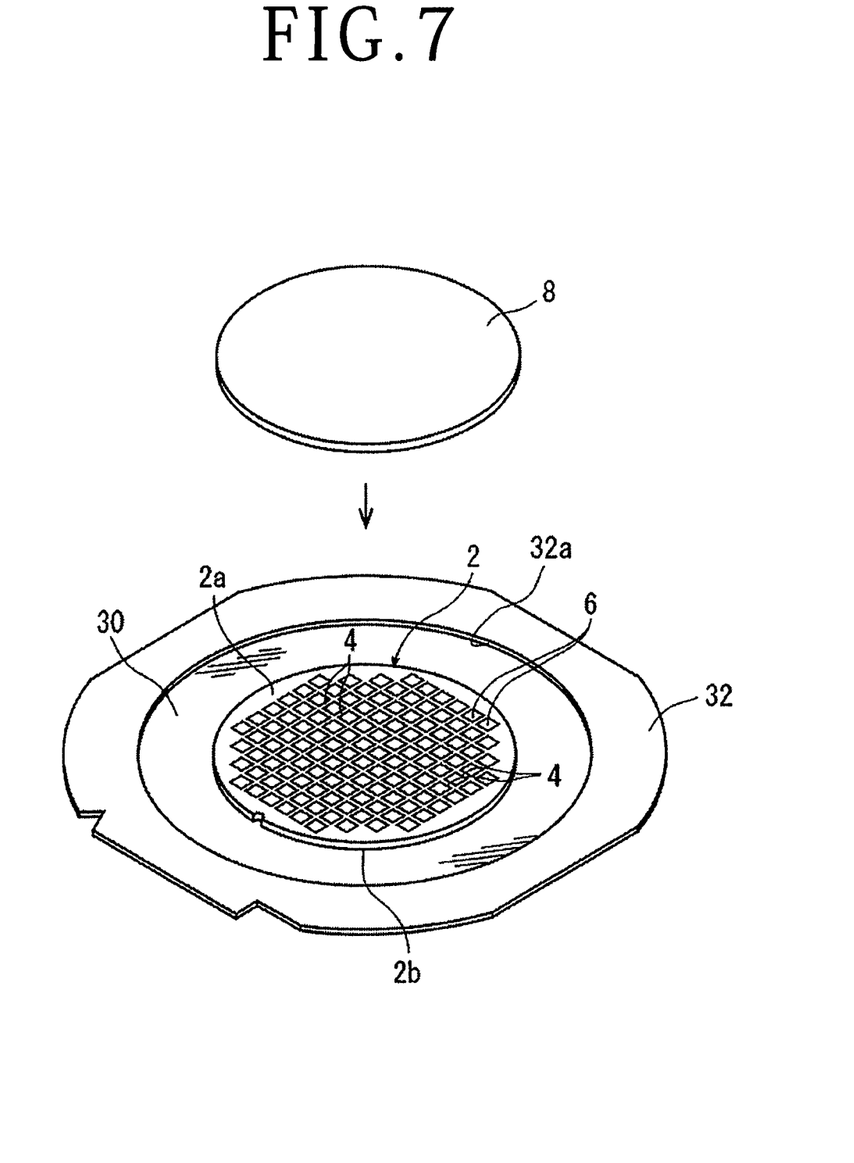
FIG. 7 is a perspective view depicting the manner in which a peeling step has been carried out.

The UV-curable resin destroying step is followed by a peeling step to peel off the support substrate 8 from the face side 2a of the wafer 2. As the UV-curable resin destroying step has destroyed only the UV-curable resin 10 without causing damage to the support substrate 8 and the wafer 2, the support substrate 8 can reliably be peeled off from the face side 2a of the wafer 2 with no UV-curable resin 10 remaining on the face side 2a of the wafer 2 in the peeling step.

According to the present embodiment, as described above, since only the UV-curable resin 10 is destroyed without causing damage to the support substrate 8 and the wafer 2 in the UV-curable resin destroying step, the support substrate 8 can reliably be peeled off from the face side 2a of the wafer 2 with no UV-curable resin 10 remaining on the face side 2a of the wafer 2 in the peeling step.

In the present embodiment, the pulsed laser beam LB is applied in a spiral pattern to the support substrate 8 in the UV-curable resin destroying step. However, the pulsed laser beam LB may be applied in a concentric pattern to the support substrate 8, or may be applied in a striped pattern parallel to desired directions such as the X-axis directions, the Y-axis directions, etc. In the present embodiment, the chuck table of the laser processing apparatus 34 is rotated while at the same time the condenser 36 is moved radially outwardly of the chuck table in the UV-curable resin destroying step. In the UV-curable resin destroying step, however, the chuck table and the condenser 36 may be moved only relatively to each other. For example, the condenser 36 may not be moved, but only the chuck table may be moved, e.g., may be rotated or moved in a direction such as one of the X-axis directions, the Y-axis directions, etc. Alternatively, the chuck table may not be moved, but only the condenser 36 may be moved.

Appropriate conditions for the pulsed laser beam LB which are used in the UV-curable resin destroying step will be described below based on the results of experiments conducted by the inventors under the following experimental conditions:

Experimental Conditions

Wafers used in the experiments: wafers having a thickness of 700 μm
Support substrates used in the experiments: Glass substrates having a thickness of 1000 μm
Types of UV-curable resins used in the experiments:
NW-126-75S manufactured by Denka Co., Ltd.
SU-8 manufactured by Nippon Kayaku Co., Ltd.
Hitaloid 7903 manufactured by Hitachi Chemical Co., Ltd.
Experiments 1 through 6 described below were conducted under the following conditions with respect to the above types of UV-curable resins:
Types of laser beams used in the experiments:
Wavelengths: 365 nm, 355 nm, 343 nm, 266 nm, 248 nm, 196 nm
Repetitive frequency: 200 kHz
Average output power: 1 through 20 W
Pulse duration: 10 through 200 ps
Thickness of UV-curable resins: 5 through 50 μm
Spot diameter: The diameter of the laser beam spot positioned on the UV-curable resins was adjusted by defocusing.

Experiment 1

UV-curable resin: NW-126-75S manufactured by Denka Co., Ltd., 10 μm thick
Wavelength: 365 nm
Repetitive frequency: 200 kHz
Average output power: 1 W
Pulse duration: 10 ps
Spot diameters: 3 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 110 μm, 120 μm, 130 μm, 140 μm
[Method of Experiment 1]
While changing the peak power density by changing the diameter of the laser beam spot positioned on the UV-curable resin, the laser beam was applied from the support substrate side to the UV-curable resin interposed between the support substrate and the wafer.
[Results of Experiment 1]

| Spot diameter (μm) | Peak power density (GW/cm$^2$) | Support substrate | UV-curable resin | Wafer |
|---|---|---|---|---|
| 3 | 7077 | Destroyed | Destroyed | Destroyed |
| 5 | 2547 | Destroyed | Destroyed | Destroyed |
| 10 | 637 | Destroyed | Destroyed | Destroyed |
| 15 | 283 | Destroyed | Destroyed | Destroyed |
| 20 | 159 | Destroyed | Destroyed | Destroyed |
| 25 | 102 | Destroyed | Destroyed | Destroyed |
| 30 | 71 | Destroyed | Destroyed | Destroyed |
| 35 | 52 | Destroyed | Destroyed | Destroyed |
| 40 | 40 | Destroyed | Destroyed | Destroyed |
| 45 | 31 | Destroyed | Destroyed | Slightly good |
| 50 | 25 | Destroyed | Destroyed | Good |
| 55 | 21 | Destroyed | Destroyed | Good |
| 60 | 18 | Destroyed | Destroyed | Good |
| 65 | 15 | Destroyed | Destroyed | Good |
| 70 | 13 | Destroyed | Destroyed | Good |
| 75 | 11 | Destroyed | Destroyed | Good |
| 80 | 10 | Slightly destroyed | Destroyed | Good |
| 85 | 9 | Slightly destroyed | Destroyed | Good |
| 90 | 8 | Slightly destroyed | Destroyed | Good |
| 95 | 7 | Slightly destroyed | Destroyed | Good |
| 100 | 6 | Good | Slightly destroyed | Good |
| 110 | 5 | Good | Slightly destroyed | Good |
| 120 | 4 | Good | Not destroyed | Good |
| 130 | 4 | Good | Not destroyed | Good |
| 140 | 3 | Good | Not destroyed | Good |

[Conclusion Based on Experiment 1]
In Experiment 1, only the UV-curable resin could not be destroyed without destroying the support substrate and the wafer, and hence the conditions of Experiment 1 are regarded as inappropriate conditions. "Good" in the processed status in the results of Experiment 1 means that the support substrate and the wafer are not destroyed by the laser beam, this also holding true in the results of Experiments 2 through 6.

Experiment 2

UV-curable resin: NW-126-75S manufactured by Denka Co., Ltd., 10 μm thick
Wavelength: 355 nm
Repetitive frequency: 200 kHz
Average output power: 1 W
Pulse duration: 10 ps
Spot diameters: 3 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 110 μm, 120 μm, 130 μm, 140 μm
[Method of Experiment 2]
While changing the peak power density by changing the diameter of the laser beam spot positioned on the UV-curable resin, the laser beam was applied from the support substrate side to the UV-curable resin interposed between the support substrate and the wafer.
[Results of Experiment 2]

| Spot diameter (μm) | Peak power density (GW/cm$^2$) | Support substrate | UV-curable resin | Wafer |
|---|---|---|---|---|
| 3 | 7077 | Destroyed | Destroyed | Destroyed |
| 5 | 2547 | Destroyed | Destroyed | Destroyed |
| 10 | 637 | Destroyed | Destroyed | Destroyed |
| 15 | 283 | Destroyed | Destroyed | Destroyed |
| 20 | 159 | Destroyed | Destroyed | Destroyed |
| 25 | 102 | Destroyed | Destroyed | Destroyed |
| 30 | 71 | Destroyed | Destroyed | Destroyed |
| 35 | 52 | Destroyed | Destroyed | Destroyed |
| 40 | 40 | Destroyed | Destroyed | Destroyed |
| 45 | 31 | Destroyed | Destroyed | Slightly good |
| 50 | 25 | Slightly destroyed | Destroyed | Good |
| 55 | 21 | Slightly destroyed | Destroyed | Good |

-continued

| Spot diameter (μm) | Peak power density (GW/cm²) | Processed status | | |
|---|---|---|---|---|
| | | Support substrate | UV-curable resin | Wafer |
| 60 | 18 | Slightly destroyed | Destroyed | Good |
| 65 | 15 | Slightly destroyed | Destroyed | Good |
| 70 | 13 | Slightly destroyed | Destroyed | Good |
| 75 | 11 | Slightly destroyed | Destroyed | Good |
| 80 | 10 | Slightly destroyed | Destroyed | Good |
| 85 | 9 | Slightly destroyed | Destroyed | Good |
| 90 | 8 | Slightly destroyed | Destroyed | Good |
| 95 | 7 | Slightly destroyed | Destroyed | Good |
| 100 | 6 | Good | Slightly destroyed | Good |
| 110 | 5 | Good | Slightly destroyed | Good |
| 120 | 4 | Good | Not destroyed | Good |
| 130 | 4 | Good | Not destroyed | Good |
| 140 | 3 | Good | Not destroyed | Good |

[Conclusion Based on Experiment 2]

In Experiment 2, only the UV-curable resin could not be destroyed without destroying the support substrate and the wafer, and hence the conditions of Experiment 2 are regarded as inappropriate conditions.

Experiment 3

UV-curable resin: NW-126-75S manufactured by Denka Co., Ltd., 10 μm thick
  Wavelength: 343 nm
  Repetitive frequency: 200 kHz
  Average output power: 1 W
  Pulse duration: 10 ps
  Spot diameters: 3 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 110 μm, 120 μm, 130 μm, 140 μm

[Method of Experiment 3]

While changing the peak power density by changing the diameter of the laser beam spot positioned on the UV-curable resin, the laser beam was applied from the support substrate side to the UV-curable resin interposed between the support substrate and the wafer.

[Results of Experiment 3]

| Spot diameter (μm) | Peak power density (GW/cm²) | Processed status | | |
|---|---|---|---|---|
| | | Support substrate | UV-curable resin | Wafer |
| 3 | 7077 | Destroyed | Destroyed | Destroyed |
| 5 | 2547 | Destroyed | Destroyed | Destroyed |
| 10 | 637 | Destroyed | Destroyed | Destroyed |
| 15 | 283 | Destroyed | Destroyed | Destroyed |
| 20 | 159 | Destroyed | Destroyed | Destroyed |
| 25 | 102 | Destroyed | Destroyed | Destroyed |
| 30 | 71 | Destroyed | Destroyed | Destroyed |

-continued

| Spot diameter (μm) | Peak power density (GW/cm²) | Processed status | | |
|---|---|---|---|---|
| | | Support substrate | UV-curable resin | Wafer |
| 35 | 52 | Destroyed | Destroyed | Slightly destroyed |
| 40 | 40 | Slightly destroyed | Destroyed | Good |
| 45 | 31 | Slightly destroyed | Destroyed | Good |
| 50 | 25 | Slightly destroyed | Destroyed | Good |
| 55 | 21 | Slightly destroyed | Destroyed | Good |
| 60 | 18 | Slightly destroyed | Destroyed | Good |
| 65 | 15 | Slightly destroyed | Destroyed | Good |
| 70 | 13 | Slightly destroyed | Destroyed | Good |
| 75 | 11 | Slightly destroyed | Destroyed | Good |
| 80 | 10 | Slightly destroyed | Destroyed | Good |
| 85 | 9 | Slightly destroyed | Destroyed | Good |
| 90 | 8 | Slightly destroyed | Destroyed | Good |
| 95 | 7 | Slightly destroyed | Destroyed | Good |
| 100 | 6 | Good | Slightly destroyed | Good |
| 110 | 5 | Good | Slightly destroyed | Good |
| 120 | 4 | Good | Not destroyed | Good |
| 130 | 4 | Good | Not destroyed | Good |
| 140 | 3 | Good | Not destroyed | Good |

[Conclusion Based on Experiment 3]

In Experiment 3, only the UV-curable resin could not be destroyed without destroying the support substrate and the wafer, and hence the conditions of Experiment 3 are regarded as inappropriate conditions.

Experiment 4

UV-curable resin: NW-126-75S manufactured by Denka Co., Ltd., 10 μm thick
  Wavelength: 266 nm
  Repetitive frequency: 200 kHz
  Average output power: 1 W
  Pulse duration: 10 ps
  Spot diameters: 3 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 110 μm, 120 μm, 130 μm, 140 μm

[Method of Experiment 4]

While changing the peak power density by changing the diameter of the laser beam spot positioned on the UV-curable resin, the laser beam was applied from the support substrate side to the UV-curable resin interposed between the support substrate and the wafer.

[Results of Experiment 4]

| Spot diameter (μm) | Peak power density (GW/cm²) | Processed status | | |
|---|---|---|---|---|
| | | Support substrate | UV-curable resin | Wafer |
| 3 | 7077 | Destroyed | Destroyed | Destroyed |
| 5 | 2547 | Destroyed | Destroyed | Destroyed |
| 10 | 637 | Destroyed | Destroyed | Destroyed |
| 15 | 283 | Destroyed | Destroyed | Destroyed |
| 20 | 159 | Destroyed | Destroyed | Destroyed |
| 25 | 102 | Destroyed | Destroyed | Destroyed |
| 30 | 71 | Slightly destroyed | Destroyed | Slightly destroyed |
| 35 | 52 | Good | Destroyed | Good |
| 40 | 40 | Good | Destroyed | Good |
| 45 | 31 | Good | Destroyed | Good |
| 50 | 25 | Good | Destroyed | Good |
| 55 | 21 | Good | Destroyed | Good |
| 60 | 18 | Good | Destroyed | Good |
| 65 | 15 | Good | Destroyed | Good |
| 70 | 13 | Good | Destroyed | Good |
| 75 | 11 | Good | Destroyed | Good |
| 80 | 10 | Good | Destroyed | Good |
| 85 | 9 | Good | Destroyed | Good |
| 90 | 8 | Good | Destroyed | Good |
| 95 | 7 | Good | Destroyed | Good |
| 100 | 6 | Good | Slightly destroyed | Good |
| 110 | 5 | Good | Slightly destroyed | Good |
| 120 | 4 | Good | Not destroyed | Good |
| 130 | 4 | Good | Not destroyed | Good |
| 140 | 3 | Good | Not destroyed | Good |

[Conclusion Based on Experiment 4]

In Experiment 4, only the UV-curable resin could be destroyed without destroying the support substrate and the wafer with the peak power density ranging from 5 to 50 GW/cm², and hence the conditions of Experiment 4 are regarded as appropriate conditions.

Experiment 5

UV-curable resin: NW-126-75S manufactured by Denka Co., Ltd., 10 μm thick
Wavelength: 248 nm
Repetitive frequency: 200 kHz
Average output power: 1 W
Pulse duration: 10 ps
Spot diameters: 3 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 110 μm, 120 μm, 130 μm, 140 μm

[Method of Experiment 5]

While changing the peak power density by changing the diameter of the laser beam spot positioned on the UV-curable resin, the laser beam was applied from the support substrate side to the UV-curable resin interposed between the support substrate and the wafer.

[Results of Experiment 5]

| Spot diameter (μm) | Peak power density (GW/cm²) | Processed status | | |
|---|---|---|---|---|
| | | Support substrate | UV-curable resin | Wafer |
| 3 | 7077 | Destroyed | Destroyed | Destroyed |
| 5 | 2547 | Destroyed | Destroyed | Destroyed |
| 10 | 637 | Destroyed | Destroyed | Destroyed |
| 15 | 283 | Destroyed | Destroyed | Destroyed |
| 20 | 159 | Destroyed | Destroyed | Destroyed |
| 25 | 102 | Destroyed | Destroyed | Destroyed |
| 30 | 71 | Destroyed | Destroyed | Slightly destroyed |
| 35 | 52 | Slightly destroyed | Destroyed | Good |
| 40 | 40 | Good | Destroyed | Good |
| 45 | 31 | Good | Destroyed | Good |
| 50 | 25 | Good | Destroyed | Good |
| 55 | 21 | Good | Destroyed | Good |
| 60 | 18 | Good | Destroyed | Good |
| 65 | 15 | Good | Destroyed | Good |
| 70 | 13 | Good | Destroyed | Good |
| 75 | 11 | Good | Destroyed | Good |
| 80 | 10 | Good | Destroyed | Good |
| 85 | 9 | Good | Destroyed | Good |
| 90 | 8 | Good | Destroyed | Good |
| 95 | 7 | Good | Destroyed | Good |
| 100 | 6 | Good | Slightly destroyed | Good |
| 110 | 5 | Good | Slightly destroyed | Good |
| 120 | 4 | Good | Not destroyed | Good |
| 130 | 4 | Good | Not destroyed | Good |
| 140 | 3 | Good | Not destroyed | Good |

Conclusion Based on Experiment 5

In Experiment 5, only the UV-curable resin could be destroyed without destroying the support substrate and the wafer with the peak power density ranging from 5 to 50 GW/cm², and hence the conditions of Experiment 5 are regarded as appropriate conditions.

Experiment 6

UV-curable resin: NW-126-75S manufactured by Denka Co., Ltd., 10 μm thick
Wavelength: 196 nm
Repetitive frequency: 200 kHz
Average output power: 1 W
Pulse duration: 10 ps
Spot diameters: 3 μm, 5 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, 110 μm, 120 μm, 130 μm, 140 μm

[Method of Experiment 6]

While changing the peak power density by changing the diameter of the laser beam spot positioned on the UV-curable resin, the laser beam was applied from the support substrate side to the UV-curable resin interposed between the support substrate and the wafer.

[Results of Experiment 6]

| Spot diameter (μm) | Peak power density (GW/cm²) | Processed status | | |
|---|---|---|---|---|
| | | Support substrate | UV-curable resin | Wafer |
| 3 | 7077 | Destroyed | Destroyed | Destroyed |
| 5 | 2547 | Destroyed | Destroyed | Destroyed |
| 10 | 637 | Destroyed | Destroyed | Destroyed |
| 15 | 283 | Destroyed | Destroyed | Destroyed |
| 20 | 159 | Slightly destroyed | Destroyed | Destroyed |
| 25 | 102 | Slightly destroyed | Destroyed | Destroyed |
| 30 | 71 | Slightly destroyed | Destroyed | Slightly destroyed |
| 35 | 52 | Good | Destroyed | Good |
| 40 | 40 | Good | Destroyed | Good |
| 45 | 31 | Good | Destroyed | Good |
| 50 | 25 | Good | Destroyed | Good |
| 55 | 21 | Good | Destroyed | Good |
| 60 | 18 | Good | Destroyed | Good |
| 65 | 15 | Good | Destroyed | Good |
| 70 | 13 | Good | Destroyed | Good |
| 75 | 11 | Good | Destroyed | Good |
| 80 | 10 | Good | Destroyed | Good |
| 85 | 9 | Good | Destroyed | Good |
| 90 | 8 | Good | Destroyed | Good |
| 95 | 7 | Good | Destroyed | Good |
| 100 | 6 | Good | Destroyed | Good |
| 110 | 5 | Good | Destroyed | Good |
| 120 | 4 | Good | Not destroyed | Good |
| 130 | 4 | Good | Not destroyed | Good |
| 140 | 3 | Good | Not destroyed | Good |

[Conclusion Based on Experiment 6]

In Experiment 6, only the UV-curable resin could be destroyed without destroying the support substrate and the wafer with the peak power density ranging from 5 to 50 GW/cm², and hence the conditions of Experiment 6 are regarded as appropriate conditions.

Appropriate conditions for the laser beam in the UV-curable resin destroying step based on the results of Experiments 1 through 6 will be considered below. In Experiment 1 (at the wavelength of 365 nm), Experiment 2 (at the wavelength of 355 nm), and Experiment 3 (at the wavelength of 343 nm), there were no conditions for destroying only the UV-curable resin without destroying the support substrate and the wafer, and in Experiment 4 (at the wavelength of 266 nm), Experiment 5 (at the wavelength of 248 nm), and Experiment 6 (at the wavelength of 196 nm), there were conditions for destroying only the UV-curable resin without destroying the support substrate and the wafer. Therefore, it is considered appropriate to use ultraviolet rays having a wavelength of 300 nm or shorter as the laser beam in the UV-curable resin destroying step. Furthermore, with regard to the peak power density of the laser beam used in the UV-curable resin destroying step, since the peak power density ranging from 5 to 50 GW/cm² in Experiments 4 through 6 made it possible to destroy only the UV-curable resin without destroying the support substrate and the wafer, it is considered appropriate for the peak power density of the laser beam used in the UV-curable resin destroying step to be in the range from 5 to 50 GW/cm².

In order to confirm that it is appropriate for the laser beam used in the UV-curable resin destroying step to be ultraviolet rays having a wavelength of 300 nm or shorter and also for the peak power density of the laser beam to be in the range from 5 to 50 GW/cm², the inventors also conducted the following confirmatory experiments: In the confirmatory experiments, Experiments 1 through 6 were conducted while changing the average output power of the laser beam to 5 W, 10 W, 15 W, and 20 W and using a laser beam having a pulse duration of 50 ps for the average output power of 5 W, a laser beam having a pulse duration of 100 ps for the average output power of 10 W, a laser beam having a pulse duration of 150 ps for the average output power of 15 W, and a laser beam having a pulse duration of 200 ps for the average output power of 20 W. As a consequence, substantially the same results as the results of Experiments 1 through 6 described above were obtained, confirming that it is appropriate for the laser beam used in the UV-curable resin destroying step to be ultraviolet rays having a wavelength of 300 nm or shorter and also for the peak power density of the laser beam to be in the range from 5 to 50 GW/cm². Experiments 1 through 6 were also conducted on SU-8 manufactured by Nippon Kayaku Co., Ltd. and Hitaloid 7903 manufactured by Hitachi Chemical Co., Ltd. used as the UV-curable resin, with the consequences that substantially the same results as the results of Experiments 1 through 6 described above were obtained. Experiments 1 through 6 were further conducted while changing the thickness of the UV-curable resin in a range from 5 to 50 μm at intervals of 5 μm. When the thickness of the UV-curable resin was 20 μm or smaller, the UV-curable resin was destroyed substantially 100%, and when the thickness of the UV-curable resin was 25 μm or larger, the UV-curable resin was recognized as being destroyed incompletely though it was destroyed enough to allow the support substrate to be peeled off from the wafer.

The present invention is not limited to the details of the above described preferred embodiments. The scope of the invention is defined by the appended claims and all changes and modifications as fall within the equivalence of the scope of the claims are therefore to be embraced by the invention.

What is claimed is:
1. A method of processing a wafer that has a face side demarcated by a plurality of intersecting projected dicing lines into a plurality of areas with respective devices formed therein, the method comprising:
  a support substrate preparing step of preparing a support substrate that transmits ultraviolet rays having a wavelength of 300 nm or shorter and supports the wafer thereon;
  an integrating step of integrating a face side of the wafer and the support substrate by sticking the face side of the wafer and the support substrate to each other with an UV-curable resin with an adhesive power that is lowered by ultraviolet rays applied thereto interposed therebetween, thereby integrally combining the wafer and the support substrate with each other;
  after the integrating step, a processing step of processing a reverse side of the wafer;
  after the processing step, a UV-curable resin destroying step of destroying said UV-curable resin by applying a focused laser beam to said support substrate and moving said focused laser beam along said support substrate so that focused spots of said focused laser beam on said UV-curable resin overlap each other to destroy an entirety of said UV-curable resin, wherein a peak power density of said laser beam is 5 to 50 GW/cm² and a pulse duration of said laser beam is 200 ps or less during said UV-curable resin destroying step; and after the UV-curable resin destroying step, a peeling step of peeling off said support substrate from the face side of the wafer.

2. The method according to claim 1, further comprising:
after the processing step and before the UV-curable resin destroying step, a frame supporting step of supporting on an annular frame, the wafer integrally combined with the support substrate, by sticking the reverse side of the wafer to a dicing tape and sticking an outer peripheral portion of the dicing tape to the annular frame having an opening defined therein that is large enough to accommodate the wafer therein.

3. The method according to claim 1, wherein said support substrate includes a glass substrate, and said wafer includes on the face side thereof power devices or thin film devices including thin film transistors (TFTs) or thin film inductors, and is selected from a group consisting of an Si wafer, an SiC wafer, and a GaN wafer.

4. The method according to claim 1, wherein said UV-curable resin destroying step includes moving said focused laser beam radially outwardly along said support substrate.

5. The method according to claim 1, wherein said UV-curable resin destroying step includes moving said focused laser beam radially outwardly along said support substrate in a spiral pattern.

6. The method according to claim 1, wherein said UV-curable resin destroying step includes moving said focused laser beam radially outwardly along said support substrate in a concentric pattern.

7. The method according to claim 1, wherein said UV-curable resin has a thickness of 10 μm.

8. A method of processing a wafer that has a face side demarcated by a plurality of intersecting projected dicing lines into a plurality of areas with respective devices formed therein, the method comprising:

a support substrate preparing step of preparing a support substrate that transmits ultraviolet rays having a wavelength of 300 nm or shorter and supports the wafer thereon;

an integrating step of integrating a face side of the wafer and the support substrate by sticking the face side of the wafer and the support substrate to each other with an UV-curable resin with an adhesive power that is lowered by ultraviolet rays applied thereto interposed therebetween, thereby integrally combining the wafer and the support substrate with each other;

after the integrating step, a processing step of processing a reverse side of the wafer;

after the processing step, an adjusting step of adjusting a vertical position of a focused laser beam relative to said support substrate to adjust a diameter of a focused spot of said focused laser beam on said UV-curable resin;

after the adjusting step, a UV-curable resin destroying step of destroying said UV-curable resin by applying a focused laser beam to said support substrate and moving said focused laser beam along said support substrate, wherein a peak power density of said laser beam is 5 to 50 GW/cm$^2$ and a pulse duration of said laser beam is 200 ps or less during said UV-curable resin destroying step; and after the UV-curable resin destroying step, a peeling step of peeling off said support substrate from the face side of the wafer.

* * * * *